Oct. 21, 1958 HUNG CHANG LIN 2,857,462

TRANSISTOR AMPLIFIER CIRCUIT

Filed July 12, 1956

INVENTOR.
HUNG CHANG LIN

BY H. C. Newton

ATTORNEY

United States Patent Office 2,857,462

Patented Oct. 21, 1958

2,857,462

TRANSISTOR AMPLIFIER CIRCUIT

Hung Chang Lin, Levittown, Pa., assignor to Radio Corporation of America, a corporation of Delaware Application July 12, 1956, Serial No. 597,506

3 Claims. (Cl. 179—1)

This invention relates to transistor amplifier circuits and more particularly to a transistor input amplifier circuit adapted for use with crystal electro-mechanical sound transducers and the like.

Electro-mechanical sound transducers that have essentially a capacitive internal impedance, such as crystal or ceramic microphones and phonograph pickups, are generally operated into an amplifier having a high impedance input circuit in order to obtain a flat output response down to the low bass frequencies. High impedance circuits are used with electron tube amplifier circuits, since a very high input impedance may easily be obtained. However, if transistor amplifier circuits are used, it is difficult to obtain a high input impedance without encountering noise and stability problems or the loss of gain in the amplifier circuits.

It is therefore an object of this invention to provide an improved transistor signal amplifier circuit for electro-mechanical sound transducers or the like that have an essentially capacitive internal impedance.

It is another object of the invention to provide an improved transistor amplifier circuit for crystal or ceramic phonograph transducers or the like providing equalization for the output characteristics of the transducers, together with low distortion and low noise characteristics for the amplifier circuit.

It is yet another object of the invention to provide an improved transistor input amplifier circuit for crystal or ceramic phonograph transducers or the like in which the transistors or the transducers may be changed without affecting the circuit operation.

In accordance with the invention, a transducer having an essentially capacitive internal impedance and a frequency dependent output current is connected into the low input impedance base-to-emitter electrode circuit of a common emitter transistor amplifier. The input impedance of the amplifier is maintained low with respect to the source impedance of the transducer at all frequencies by the use of negative feedback. The amplifier is equalized by providing that the output signal current of the transistor is constant with respect to frequency by making the feedback frequency selective to vary the current gain of the amplifier to conform to the desired equalization characteristics.

The invention may further be understood from the following description read in connection with the accompanying drawings, in which.

Figure 1:
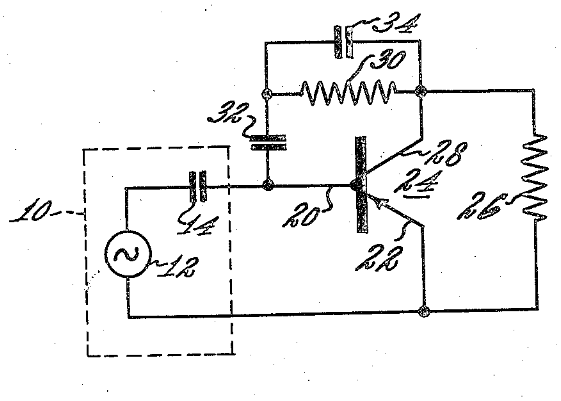
Figure 1 is a simplified schematic circuit diagram of an improved transistor amplifier circuit, and equivalent circuit for a crystal pickup type of signal source, illustrating the principle of operation of the invention.
Figure 2:
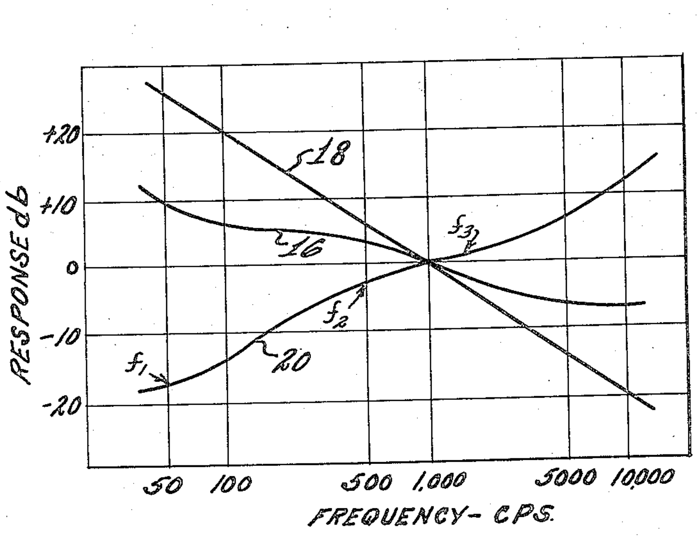
Figure 2 is a graph showing curves illustrating certain operational features of the invention; and, Figure 3 is a schematic circuit diagram of an improved transistor amplifier circuit for a crystal pickup, embodying the invention.

Referring now to Figures 1 and 2, a crystal or ceramic phonograph transducer 10 or the like is electrically represented by an equivalent circuit which includes a voltage generator 12 in series with a capacitor 14. Crystal phonograph transducers may have an internal capacitance on the order of 1,000 micro-micro-farads and a frequency dependent output voltage on the order of one volt. The open circuit output voltage of a typical crystal phonograph transducer when reproducing a commercial phonograph recording having recording characteristics in accordance with present standards, may have a characteristic as represented by curve 16 of the graph of Figure 2. The RIAA (Recording Industry Association of America) recording standards for phonograph records utilized by many manufacturers of phonograph records are published in Radio and Television News for July 1954, page 49, titled "The Curve That Conforms", or the Journal of the Audio Engineering Society for October 1955, page 202, titled "Magnetic Pickups and Proper Playback Equalization". It will be seen from curve 16 of Figure 2 that the combination of the decreased output voltage of the crystal transducer with frequency and the recording characteristic of the record will result in a voltage output from the transducer that is greater at frequencies below approximately 1,000 cycles than it is at frequencies above 1,000 cycles. Since the recording characteristics of each record manufactured may vary slightly, the shape of the curve 16 of Figure 2 of the output voltage of the transducer may vary slightly when different manufacturers' records are being reproduced; however, the curve 16 will be of the same general shape as that shown. The impedance of a crystal transducer is essentially capacitive and the reactance of the transducer with respect to frequency may be conveniently represented on the logarithmic scale of Figure 2 as a straight line 18 decreasing in value with an increase in frequency.

The output current of the crystal transducer 10 or the like will, of course, be dependent upon its own impedance, the impedance into which it works, and its own generated voltage. If the load impedance is made small with respect to its own internal impedance, as represented by its own capacitive reactance, the current will be substantially equal to the voltage generated by the transducer 10 divided by its own capacitive reactance. Thus, the output current of a phonograph transducer having characteristics as depicted in curves 16 and 18 of Figure 2 and working into a load having an impedance small with respect to its own reactance will take the form of curve 20 of the same figure.

Referring again to Figure 1, the output terminals of the crystal transducer 10 are connected between the base electode 20 and the emitter electrode 22 of a transistor amplifier device 24, here illustrated as a PNP type junction transistor. Although an N type or PNP transistor has been illustrated, it is to be understood that transistors of opposite conductivity, that is, P type or NPN transistors, may be used in the circuit with a reversal of the energizing potentials, as is well known. A load resistor 26 is connected between the collector electrode 28 and the emitter electrode 22. A feedback circuit, the function of which will be more fully explained hereinafter, is connected between the collector electrode 28 and the base electrode 20, and comprises a feedback resistor 30 connected in series with a first feedback capacitor 32 between the collector 28 and the base 20, with a second feedback capacitor 34 connected in parallel with the feedback resistor 30. The usual biasing and energizing potentials have not been shown in the figure to facilitate explanation, but, of course, would be provided in a complete operational circuit as hereinafter shown and described.

It should be noted again at this point that the resultant output current of the crystal transducer 10 when reproducing a commercial phonograph record may be shown by the curve 20 of Figure 2 and indicates, generally, that the current rises as the frequency of the signal increases. It is desired, of course, that the output current of the transistor 24 of Figure 1 be flat, that is, not varying with respect to frequency.

It will be noted from an inspection of the curve 20 of Figure 2, that to provide a flat output current from the transistor 24 with respect to frequency, the circuit should begin attenuating the output current of the transistor 24 at the frequency $f_1$ (approximately 50 C. P. S.) at the rate of 6 decibels per octave. This attenuation should begin to reduce and level off at the frequency $f_2$ (approximately 500 C. P. S.) and should continue to the frequency $f_3$ (approximately 2,000 C. P. S.), at which frequency the circuit should again begin attenuating the current output at approximately 6 decibels per octave. This multiple attenuation is provided by the collector-to-base feedback circuit shown in Figure 1. At signal frequencies below $f_1$ (50 C. P. S.), the reactance of the first feedback capacitor 32 is large enough to prevent any effective feedback signal, since its reactance to low frequency signals is made very large. The current gain of the transistor 24 then is approximately equal to the collector-to-base current amplification, $\alpha_{cb}$, of the transistor 24 and the input impedance will be on the order of a few thousands ohms in the common emitter connection. Since the impedance of the transducer 10 at below frequency $f_1$ is on the order of megohms, the input impedance of the transistor 24 is small enough to be neglected.

As has been previously noted, at frequencies above $f_1$ (50 C. P. S.) the feedback should become effective to reduce the current gain of the transistor 24. This may be accomplished by choosing the reactance of the first feedback capacitor 32 to be equal, at frequency $f_1$ (50 C. P. S.), to the current gain from collector-to-base, $\alpha_{cb}$, of the transistor 25 multiplied by the resistance value of the load resistor 26. As the frequency increases above $f_1$ (50 C. P. S.) the reactance of the first feedback capacitor 32 will decrease and begin feeding back current in degenerative phase to the base electrode 20 that will lower the current gain of the transistor 24 and provide an attenuation of the output current of the transistor 24 on the order of 6 decibels per octave. The 6 decibels per octave attenuation will continue until approximately frequency $f_2$ (500 C. P. S.), at which point, as before mentioned, the attenuation should begin to level off. The "leveling" may be accomplished by making the value of the feedback resistor 30 equal to $$\frac{1}{2\pi f_2 C_{32}}$$

where $f_2$ is the frequency $f_2$ (500 C. P. S.), and $C_{32}$ is the value of the first feedback capacitor 32 in farads. The valve of the feedback resistor 30 thus prevents the feedback from becoming too large as the value of the reactance of the first feedback capacitor 32 decreases as the frequency increases.

The attenuation will be controlled mainly by the feedback resistor 30 between the frequencies $f_2$ and $f_3$ (500 to 2,000 C. P. S.). At the frequency $f_3$ (2,000 C. P. S.) the circuit should again begin attenuating at 6 decibels per octave. This action is provided by making the value of the second feedback capacitor 34 equal to the value of the feedback resistor 30 divided by $$\frac{1}{2\pi f_3}$$

At frequencies above $f_3$ the negative feedback is thus controlled by the value of the second feedback capacitor 34 and will continue to attenuate the output current at the rate of 6 decibels per octave. The action of the feedback thus lowers the current gain of the transistor 24 to provide a constant output current from the collector electrode 28 with respect to frequency.

It will be noted that at the same time as the circuit is providing the required degree of attenuation of the current gain of the transistor 24, it is also reducing the input impedance of the transistor. The input impedance will be reduced by an amount approximately equal to $$\frac{\alpha_{cb} R_L}{Zf}$$

where $R_L$ is the value of the load resistor 26, $\alpha_{cb}$ is the collector-to-base current gain of the transistor, and $Z_f$ is the effective impedance of the feedback network which varies with frequency. At frequencies between $f_1$ and $f_2$, as noted on the curves of Figure 2, $Z_f$ will be substantially equal to $$\frac{1}{2\pi f C_1}$$

where $f$ is a frequency between $f_1$ and $f_2$; and $C_1$ is the value of the first feedback capacitor 32. At the frequencies between $f_2$ and $f_3$, $Z_f$ will substantially equal to the value of the feedback resistor 30; and at frequencies above $f_3$, $Z_f$ will be substantially equal to $$\frac{1}{2\pi f C_2}$$

where $f$ is a frequency above $f_3$, and $C_2$ is the value of the second feedback capacitor 34. It will be seen that as the frequency increases, the input impedance will decrease so that it will remain at all frequencies small compared to the impedance of the transducer 10, the impedance of which is also decreasing with frequency.

When the input current to the transistor is determined by the high source impedance of the transducer 10 and not the low input impedance of the transistor 24, transducers having different values of internal capacitance may be freely interchanged without appreciably affecting the flat frequency response of the circuit. The transistor 24 is also effectively fed from a current generator so that the negative current feedback will be effective to reduce distortion in the circuit, and permits the use of low D.-C. operating currents which provide a better noise figure for the transistor amplifier.

The negative feedback will also maintain a relatively constant current gain for the amplifier stage regardless of variations in the $\alpha_{cb}$ of the transistor 24 or in the value of the energizing supply, so that different transistors may be freely interchanged in the circuit. Additionally, the use of a low input impedance in the transistor stage renders the circuit more easily compensated with respect to temperature, as is well known.

Figure 3:
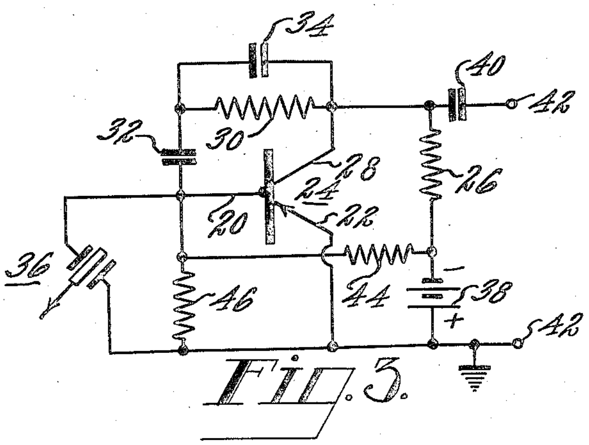

Referring now to Figure 3, a transistor amplifier circuit including many of the components shown in Figure 1 adapted to be connected directly to a crystal phonograph transducer of pickup 36, includes the transistor 24 and its associated circuitry. The crystal phonograph transducer 36 is connected directly between the base and emitter electrodes 20 and 22. The load resistor 26 is connected between the collector electrode 28 and the negative terminal of a direct current supply source 38, which may be a battery as indicated, the positive terminal of which is connected to the emitter electrode 22. Output signals are coupled through a coupling capacitor 40 from the collector electrode 28 to one of a pair of output terminals 42, the other of which is connected to the emitter electrode 22, which may be at ground potential for the amplifier as indicated. The feedback resistor 30 and the first and second feedback capacitors 32 and 34 are connected between the collector electrode 28 and a base electrode 20, as previously described in connection with Figure 1, and bias for the base electrode 20 is provided by connecting thereto the junction of a pair of voltage divider resistors 44 and 46 shunted across the battery 38.

The operation of the circuit is identical to that described with reference to Figure 1, and output signals may be conveyed from the output terminals 42 to any further stages of amplification that may be desired. The circuit values for equalization for phonograph records having the previously mentioned RIAA recording characteristics are as follows:

| | |
|---|---|
| Transistor **24** | Type 2N109. |
| Resistor **26** | 820 ohms. |
| Resistor **30** | 6800 ohms. |
| Capacitor **32** | .05 micro-farad. |
| Capacitor **34** | .015 micro farad. |
| Resistor **44** | 56,000 ohms. |
| Resistor **46** | 15,000 ohms. |
| Battery **38** | 4.5 v. |

The frequency response of the circuit shown in Figure 3, using the values as indicated, is flat within plus or minus two decibels from 30 to 15,000 cycles using a variety of crystal phonograph transducers 36 having internal capacitances varying from 1,000 to 2,000 micromicrofarads. The distortion measured in the circuit is approximately 1/10 of 1 percent and the output is 3 decibels greater than that for conventional high impedance input circuits utilizing transistors.

A transistor amplifier circuit for crystal and ceramic phonograph transducers or the like, constructed in accordance with the invention is characterized by its adaptability for use with a wide variety of transducers varying in internal impedance and by its low distortion and noise characteristics; and is achieved in a simple and economical circuit that offers wide application in the field of phonograph and like apparatus.

What is claimed is:

1. A transistor audio frequency signal output circuit for a phonograph transducer having essentially capacitive internal impedance and signal current output dependent upon the signal frequency comprising in combination; a transistor having base, emitter and collector electrodes; means for applying the output current developed by said transducer to said base and emitter electrodes; means for deriving an output signal from said collector electrode; and frequency selective negative feedback means including a serially connected resistor and first capacitor connected between said collector and the base electrodes and a second capacitor connected in parallel with said resistor for maintaining the output current of said transistor constant with respect to frequency-induced changes in the output current of said transducer; said first capacitor having a high reactance value to low audio or bass frequency signals to lower the current gain of said transistor in response to such low audio or bass frequency signals; said resistor having a resistance value substantially equal to the reactance value of said first capacitor at low mid-range audio frequency signals to limit the amount by which said current gain may be lowered by feedback through said first capacitor in response to mid-range audio frequency signals; and said second capacitor having a reactance substantially equal to the value of said resistor at high mid-range audio frequency signals value to further lower the current gain of said transistor in response to high audio or treble frequency signals.

2. An audio frequency signal translating circuit comprising, a phonograph transducer device having essentially capacitive internal impedance and output current dependent upon the frequency of a translated signal; a transistor having base, emitter and collector electrodes; circuit means for applying the output current developed by said transducer device to said base and emitter electrodes as a signal input current for said transistor; means for deriving an amplified output signal from the collector electrode of said transistor; and frequency selective negative feedback means including a serially connected resistor and first capacitor connected between said collector and base electrodes and a second capacitor connected in parallel with said resistor, for reducing the current gain and maintaining the collector current of said transistor constant with respect to frequency induced changes in the output current of said transducer; said first capacitor having a high reactance value at low audio or bass frequency signals to provide feedback current to said base electrode to lower the current gain of said transistor in response to low audio or bass frequency signals; said resistor having a resistance value substantially equal to the reactance value of said first capacitor at low mid-range audio frequency signals to limit the amount by which said current gain may be lowered by feedback through said first capacitor in response to mid-range audio frequency signals; and said second capacitor having reactance value substantially equal to the value of said resistor at high mid-range audio frequency signals to further increase said feedback current and further lower the current gain of said transistor in response to high audio or treble frequency signals.

3. An audio frequency signal translating circuit comprising, a phonograph transducer device having essentially capacitive internal impedance and output current dependent upon the frequency of translated signal; a transistor having base, emitter and collector electrodes; circuit means for applying the output current developed by said transducer device to said base and emitter electrodes as a signal input current for said transistor; means for deriving an amplified output signal from the collector electrode of said transistor; a serially connected resistor and first capacitor connected between said collector and the base electrodes; said first capacitor having a high reactance value at low audio or bass frequency signals, and said resistor having a resistance value substantially equal to the reactance value of said first capacitor at low mid-range audio frequency signals; and a second capacitor connected in parallel with said resistor having a reactance value at high mid-range audio frequency signals substantially equal to the value of said resistor.

References Cited in the file of this patent

UNITED STATES PATENTS 2,660,624 Bergson ---------- Nov. 24, 1953